(12) United States Patent
Yoshida et al.

(10) Patent No.: US 10,558,128 B2
(45) Date of Patent: Feb. 11, 2020

(54) CONTROL DEVICE, LITHOGRAPHY APPARATUS, AND METHOD OF MANUFACTURING ARTICLE

(71) Applicant: CANON KABUSHIKI KAISHA, Tokyo (JP)

(72) Inventors: Koji Yoshida, Utsunomiya (JP); Junichi Motojima, Utsunomiya (JP); Mitsuhide Nishimura, Utsunomiya (JP); Yoshihiro Omameuda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/394,154

(22) Filed: Apr. 25, 2019

(65) Prior Publication Data

US 2019/0339624 A1  Nov. 7, 2019

(30) Foreign Application Priority Data

May 1, 2018  (JP) .................. 2018-088405

(51) Int. Cl.
*G03F 7/20*  (2006.01)

(52) U.S. Cl.
CPC ...... *G03F 7/70591* (2013.01); *G03F 7/70616* (2013.01)

(58) Field of Classification Search
CPC ............. G03F 7/70725; G03F 7/70591; G03F 7/70616
USPC ..................................... 355/72–76
See application file for complete search history.

(56) References Cited

U.S. PATENT DOCUMENTS

| | | | |
|---|---|---|---|
| 5,900,707 A | * | 5/1999 | Wakui ................ G03F 7/70358 318/560 |
| 9,140,997 B2 | | 9/2015 | Harayama et al. |
| 2007/0219647 A1 | | 9/2007 | Heertjes |
| 2007/0250187 A1 | | 10/2007 | Heertjes |

(Continued)

FOREIGN PATENT DOCUMENTS

| | | | | |
|---|---|---|---|---|
| JP | 201027686 | * | 5/2009 | .......... H01L 21/028 |
| JP | 2010272686 | * | 5/2009 | |
| JP | 5968017 B2 | | 8/2016 | |

OTHER PUBLICATIONS

Extended European Search Report issued in European Appln. No. 19168315.0 dated Nov. 5, 2019.

*Primary Examiner* — Hung Nguyen
(74) *Attorney, Agent, or Firm* — Rossi, Kimms & McDowell LLP

(57) ABSTRACT

The present invention provides a control device that performs position control of a control target by giving a feedforward manipulated value to the control target, wherein the device obtains, for each of a plurality of positions at which the control target is to be arranged, a measurement result of a first output response of the control target obtained when giving a first manipulated value to the control target, determines a reference value of the first output response, based on the measurement results respectively obtained at the plurality of positions, determines a second manipulated value by arraying a plurality of first manipulated values in time-series based on a relationship between the first manipulated value and the reference value, and sets the feedforward manipulated value based on the second manipulated value.

29 Claims, 8 Drawing Sheets

(56) References Cited

U.S. PATENT DOCUMENTS

2010/0198371 A1  8/2010  Takagi
2017/0017168 A1  1/2017  Liao

* cited by examiner

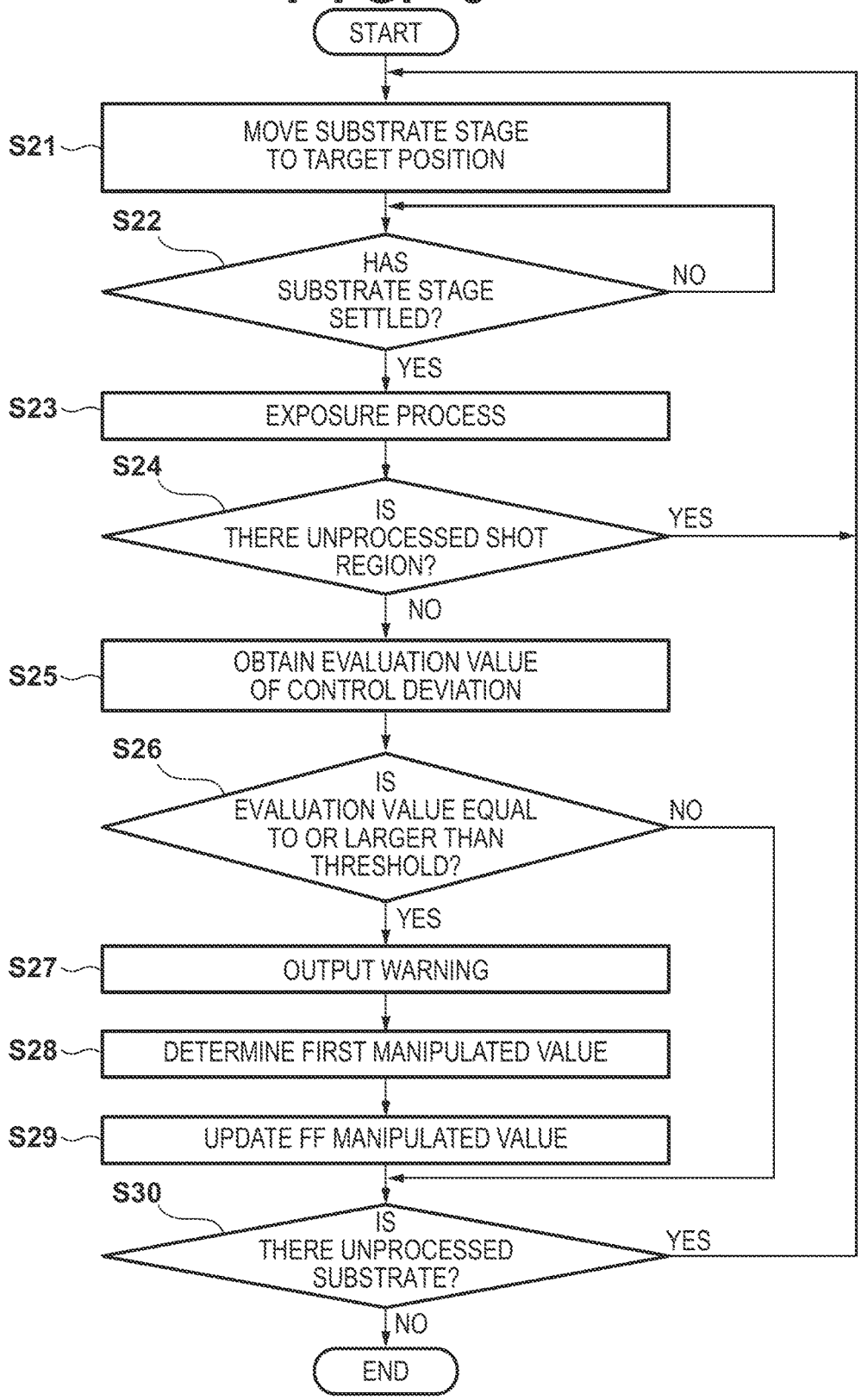

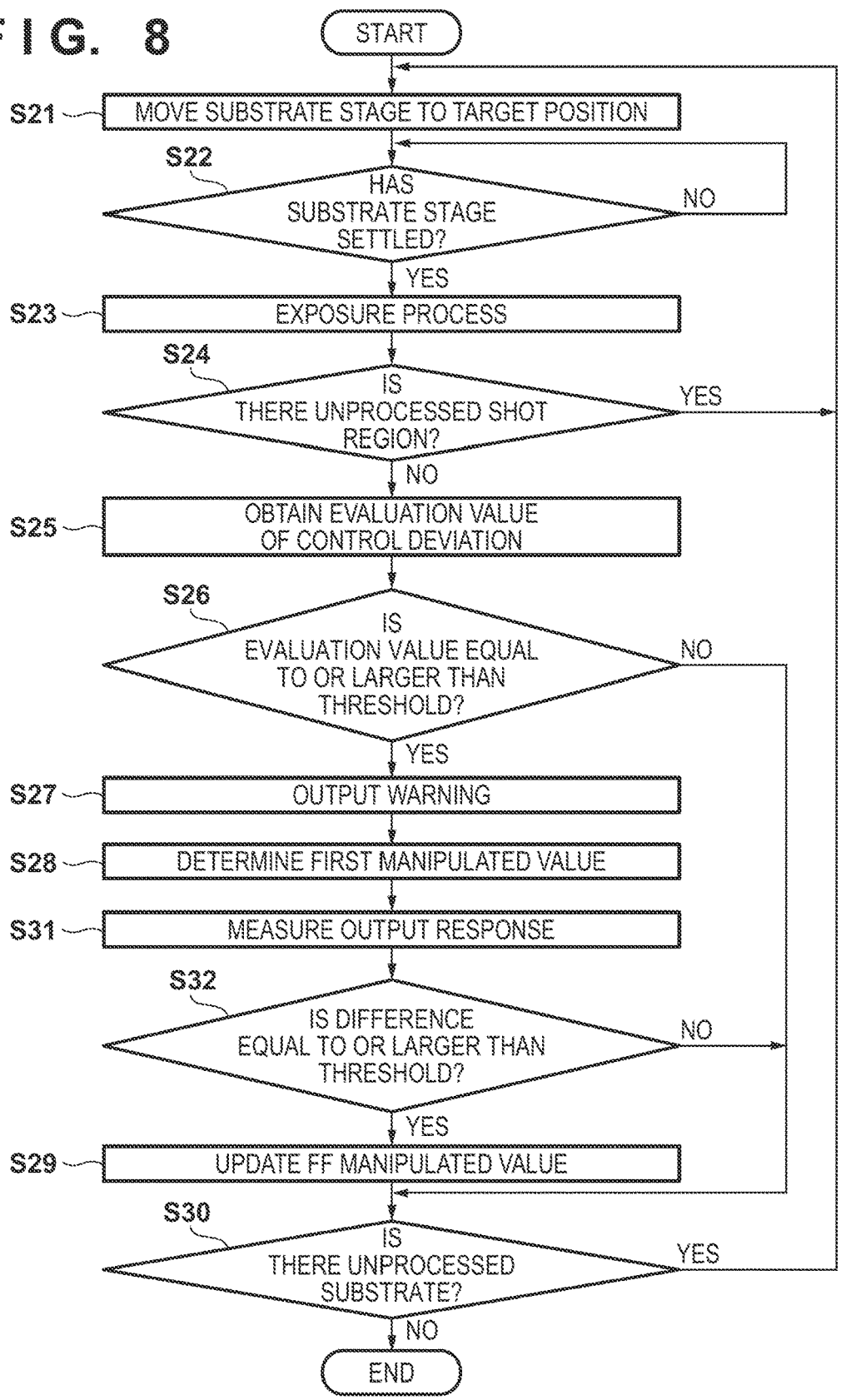

CONTROL DEVICE, LITHOGRAPHY APPARATUS, AND METHOD OF MANUFACTURING ARTICLE

BACKGROUND OF THE INVENTION

Field of the Invention

The present invention relates to a control device, a lithography apparatus, and a method of manufacturing an article.

Description of the Related Art

In a lithography apparatus used for manufacturing semiconductor devices and the like, it is advantageous in terms of throughput to quickly reduce the control deviation when a control target (a target to be controlled) such as a stage holding an original or a substrate is moved to a target position. Japanese Patent No. 5968017 proposes to measure the response of a stage (control target) when a predetermined manipulated value (an operation amount) such as an impulse signal is given to the stage and, based on the measurement result, to generate a feedforward manipulated value to be given to the stage so as to reduce the control deviation. By giving the feedforward manipulated value generated in this manner to the stage and performing position control of the stage, it is possible to quickly reduce the control deviation of the stage moved to the target position and shorten the settling time.

In the lithography apparatus, there are a plurality of target positions to which the stage is to be moved and, at the plurality of target positions, the responses of the stage obtained when a predetermined manipulated value is given to the stage may be different from each other. Therefore, when a feedforward manipulated value is generated from the measurement result of the response of the stage obtained when a predetermined manipulated value is given thereto at one position, depending on the target position, it may be difficult to quickly reduce the control deviation of the stage by using this feedforward manipulated value.

SUMMARY OF THE INVENTION

The present invention provides a technique advantageous in, for example, quickly reducing the control deviation of a control target.

According to one aspect of the present invention, there is provided a control device that performs position control of a control target by giving a feedforward manipulated value to the control target, wherein the control device is configured to: obtain, for each of a plurality of positions at which the control target is to be arranged, a measurement result of a first output response of the control target obtained when giving a first manipulated value to the control target; determine a reference value of the first output response, based on the measurement results respectively obtained at the plurality of positions; determine a second manipulated value by arraying a plurality of first manipulated values in time-series and multiplying each of the plurality of first manipulated values by a coefficient, wherein the coefficient is adjusted such that a difference between a second output response of the control target predicted when giving the second manipulated value to the control target and a target response falls within an allowable range, and the second output response is predicted based on a relationship between the first manipulated value and the reference value; and set the feedforward manipulated value based on the second manipulated value.

Further features of the present invention will become apparent from the following description of exemplary embodiments with reference to the attached drawings.

BRIEF DESCRIPTION OF THE DRAWINGS

FIG. 6 is a flowchart showing an exposure process and an update process of an FF manipulated value according to the second embodiment;

FIG. 8 is a flowchart showing an exposure process and an update process of an FF manipulated value according to the third embodiment.

DESCRIPTION OF THE EMBODIMENTS

Figure 1:
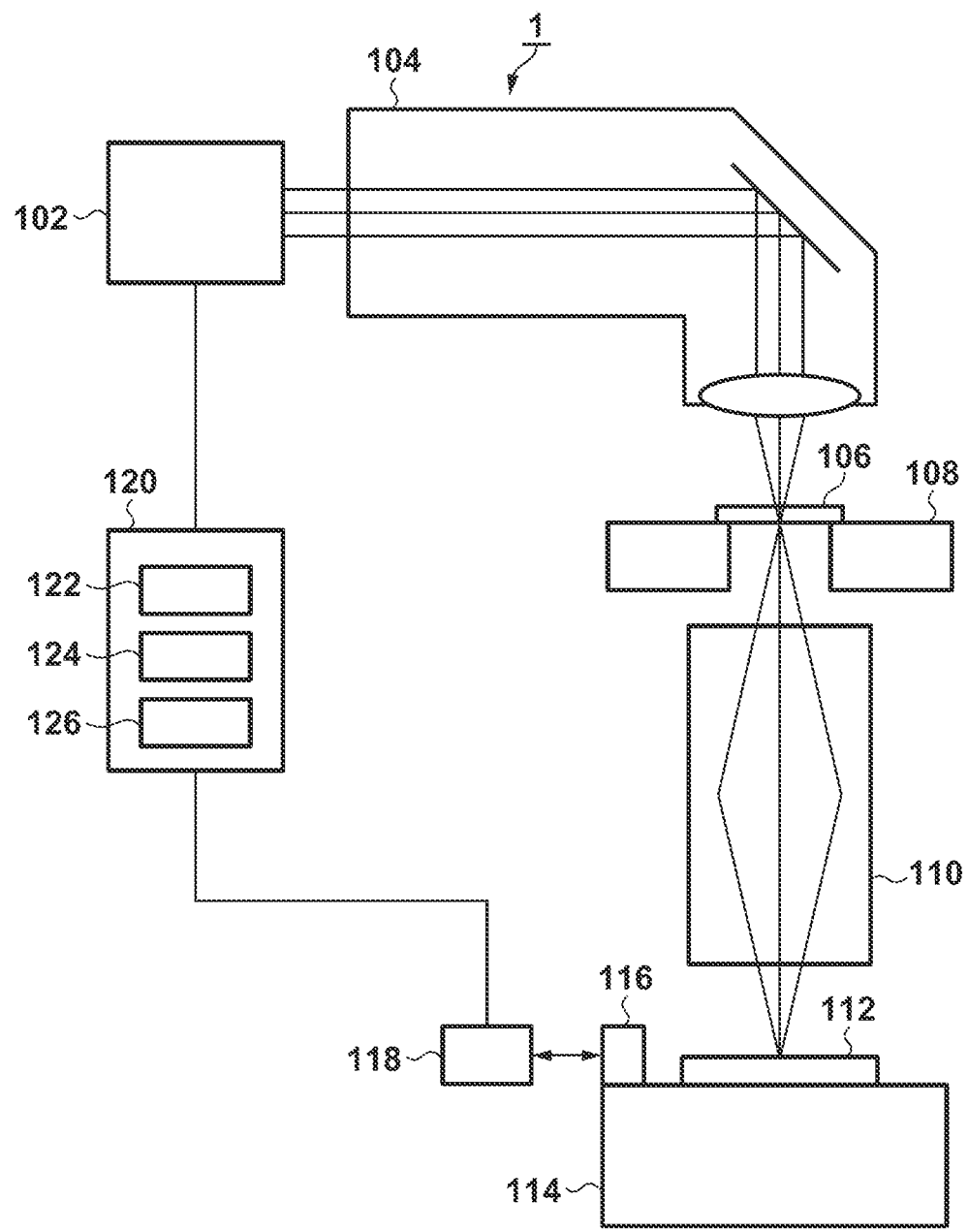
FIG. 1 is a view schematically showing the arrangement of an exposure apparatus 1.

Exemplary embodiments of the present invention will be described below with reference to the accompanying drawings. Note that the same reference numerals denote the same members throughout the drawings, and a repetitive description thereof will not be given.

In the following embodiments, an example in which the present invention is applied to an exposure apparatus that transfers the pattern of a mask (original) onto a substrate will be described, but the present invention is not limited thereto. For example, the present invention can be applied to other lithography apparatus such as an imprint apparatus that forms the pattern of an imprint material on a substrate using a mold, or a drawing apparatus that forms a pattern on a substrate by irradiating the substrate with a charged particle beam. Further, the present invention is not limited to a lithography apparatus, and can be applied to any apparatus as long as it positions a control target. In addition, a substrate stage that can move while holding a substrate is described as a control target in the following embodiments, but even when a mask stage that can move while holding a mask (original) or the like is assumed to be a control target, the present invention can be applied.

First Embodiment

An exposure apparatus 1 of the first embodiment according to the present invention will be described. FIG. 1 is a view schematically showing the arrangement of the exposure apparatus 1 of this embodiment. The exposure apparatus 1 is a scanning exposure apparatus that transfers the pattern of a mask (original) onto a substrate by a step-and-scan method. However, it is also possible to apply a step-and-repeat method or other exposure method to the exposure apparatus 1.

The exposure apparatus 1 includes an illumination optical system 104 that illuminates a mask 106 with light from a light source 102, a mask stage 108 that can move while holding the mask 106, and a projection optical system 110 that projects the pattern of the mask 106 onto a substrate. The exposure apparatus 1 further includes a substrate stage 114 that can move while holding a substrate 112, a moving mirror 116, a laser interferometer 118, and a control device 120.

As the light source 102, a light source such as an i-line light source with a wavelength of about 365 nm, a KrF excimer laser with a wavelength of about 248 nm, or an ArF excimer laser with a wavelength of 193 nm can be used. However, the type of the light source 102 and the number of light sources 102 are not particularly limited and, for example, an $F_2$ laser with a wavelength of about 157 nm may be used as the light source 102.

The illumination optical system 104 is an optical system that illuminates the mask 106 with light from the light source 102. The illumination optical system 104 includes a beam shaping optical system for shaping the shape of light from the light source 102, an optical integrator for forming a number of secondary light sources for illuminating the mask 106 with a uniform illuminance distribution, and the like.

The mask 106 has a pattern to be transferred onto the substrate 112, and is held and driven by the mask stage 108. The light diffracted by (the pattern of) the mask 106 is projected onto the substrate 112 via the projection optical system 110. The mask 106 and the substrate 112 are arranged in an optically conjugate relationship. Since the exposure apparatus 1 is a step-and-scan exposure apparatus, it transfers the pattern of the mask 106 onto the substrate 112 by synchronously scanning the mask 106 and the substrate 112.

The mask stage 108 includes a mask chuck for holding (chucking) the mask 106, and is configured to be movable in the X-axis direction, the Y-axis direction, the Z-axis direction, and the rotational direction of each axis. Here, the scanning direction in the plane of the mask 106 or the substrate 112 is assumed to be the Y-axis, the direction perpendicular thereto is assumed to be the X-axis, and the direction orthogonal to the plane of the mask 106 or the substrate 112 is assumed to be the Z-axis.

The projection optical system 110 is an optical system that projects the pattern of the mask 106 onto the substrate 112. As the projection optical system 110, a refractive system, a catadioptric system, or a reflective system can be used.

The substrate 112 is a substrate onto which the pattern of the mask 106 is projected (transferred). A resist (photosensitive agent) is applied to the substrate 112. The substrate 112 includes a wafer, a glass plate, or any other substrate.

The substrate stage 114 includes a substrate chuck for holding (chucking) the substrate 112, and is configured to be movable in the X-axis direction, the Y-axis direction, the Z-axis direction, and the rotational direction of each axis. A moving mirror 116 is fixed to the substrate stage 114, and the position and speed of the substrate stage 114 are detected by the laser interferometer 118 using the moving mirror 116. That is, the laser interferometer 118 can function as a measurement unit that measures the position and speed of the substrate stage 114. The measurement unit can include a plurality of laser interferometers 118 such that the position and speed of the substrate stage 114 in the X-axis direction, the Y-axis direction, the Z-axis direction, and the rotational direction of each axis can be measured.

The control device 120 is formed by, for example, a computer (information processing device) including a CPU and a memory 126, and controls the operation (whole) of the exposure apparatus 1. For example, the control device 120 performs position control of the substrate stage 114 as a control target and controls the operation related to synchronous scanning of the mask stage 108 and the substrate stage 114. The memory 126 of the control device 120 is a storage unit that stores data related to control of the substrate stage 114. In this embodiment, the memory 126 stores a feedforward manipulated value and the like given to the substrate stage 114 by a feedforward controller 124 as will be described later.

Figure 2A:
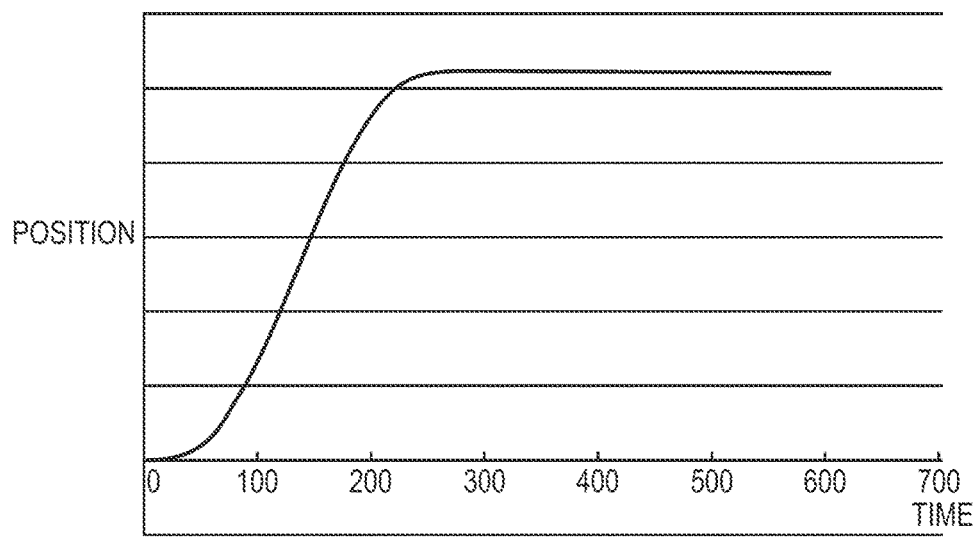
FIG. 2A is a graph showing the time-series positions of a substrate stage obtained when only feedback control is performed.
Figure 2B:
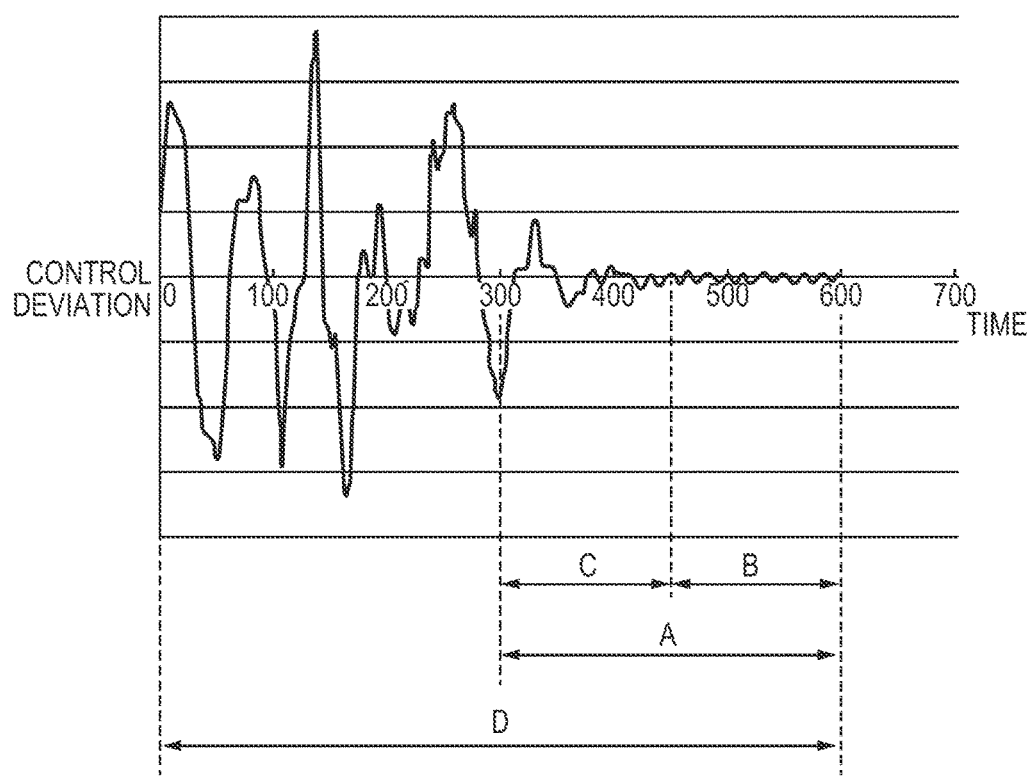
FIG. 2B is a graph showing the time-series position control deviations of the substrate stage obtained when only feedback control is performed.

In the exposure apparatus, generally, only feedback control of the substrate stage 114 can be performed so as to reduce the deviation between the current position of the substrate stage 114 and a target position. FIG. 2A is a graph showing the time-series positions of the substrate stage 114 obtained when only feedback control is performed, and FIG. 2B is a graph showing the time-series position control deviations (that is, the deviation between the current position of the substrate stage 114 and a target position) at that time. In FIG. 2A, the ordinate represents the position of the substrate stage 114, and the abscissa represents time. In FIG. 2B, the ordinate represents the position control deviation of the substrate stage 114, and the abscissa represents time. In the following description, the position control deviation of the substrate stage 114 may be simply referred to as a "control deviation".

Referring to FIG. 2A, it can be seen that the substrate stage 114 starts moving at time 0 and reaches the target position at around time 300. However, as shown in FIG. 2B, at around time 300, the control deviation of the substrate stage 114 remains largely, and it cannot be said that the substrate stage 114 has reached the target position completely. An exposure apparatus for manufacturing a semiconductor device is required to have an accuracy on the order of nanometer for positioning a substrate stage. Accordingly, in this case, the time at which an exposure process can be started is after time 450 at which the control deviation of the substrate stage 114 is settled, which can be disadvantageous in terms of throughput.

Therefore, in addition to a feedback controller 122 for performing feedback control of the substrate stage 114, the control device 120 of this embodiment includes the feedforward controller 124 for performing feedforward control of the substrate stage 114. The feedback controller 122 performs feedback control of the substrate stage 114 so as to reduce the deviation between the current position (output response) of the substrate stage 114 and a target position (target value). The feedforward controller (FF controller) 124 performs feedforward control of the substrate stage 114 by giving a feedforward manipulated value to the substrate stage 114 as a control target so that the output response of the substrate stage 114 becomes a target value (target data).

Figure 3:
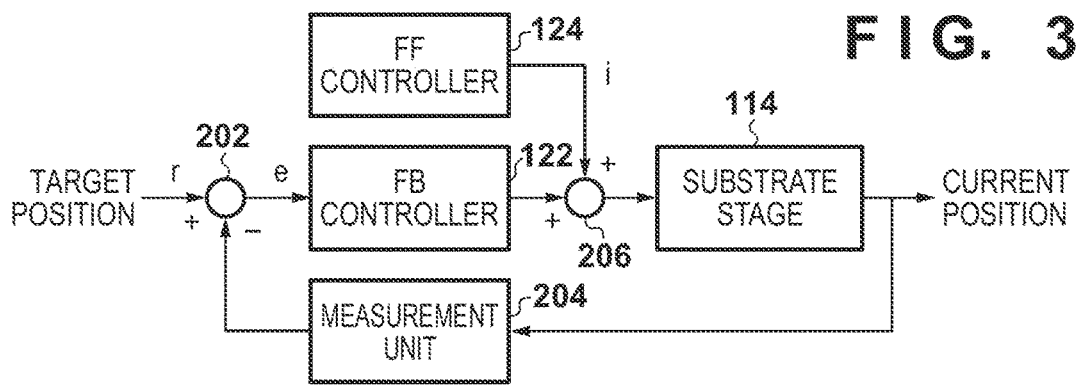
FIG. 3 is a block diagram showing position control of the substrate stage.

FIG. 3 is a block diagram showing position control of the substrate stage 114 in this embodiment. A subtractor 202 calculates a deviation e between the current position of the substrate stage 114 measured by a measurement unit 204 including the above-described laser interferometer 118 and a target position r, and outputs the deviation e to the FB controller 122. The FB controller 122 includes, for example, a PID compensator and obtains a feedback manipulated value for driving the substrate stage 114 so as to reduce the deviation calculated by the subtractor 202 (for example, to be zero) and gives the obtained feedback manipulated value to the substrate stage 114. On the other hand, the FF controller 124 adds a feedforward manipulated value i for reducing the control deviation of the substrate stage 114 to the feedback manipulated value by an adder 206 and gives it to the substrate stage 114.

Figure 4:
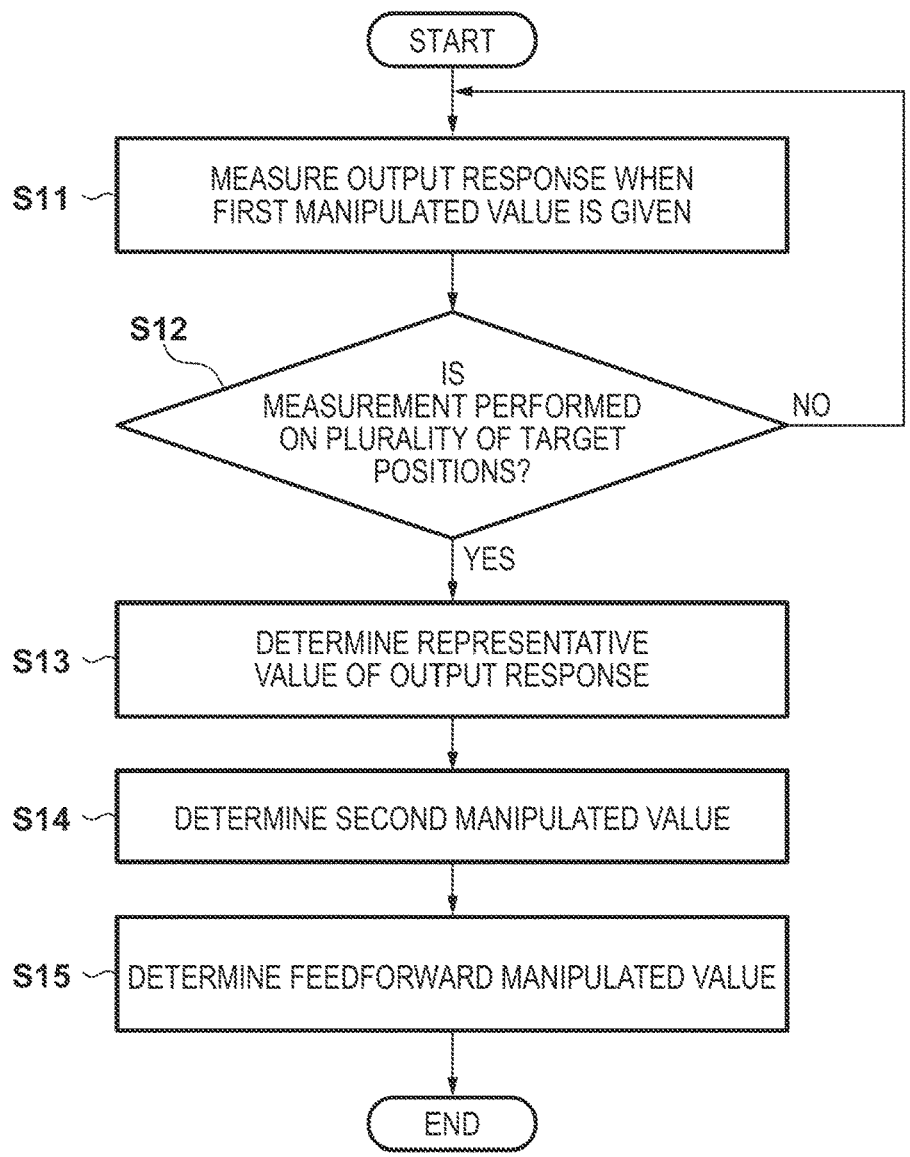
FIG. 4 is a flowchart showing a method of determining a feedforward manipulated value.

Next, a method of determining a feedforward manipulated value to be given to the substrate stage 114 by the FF controller 124 will be described with reference to FIG. 4. FIG. 4 is a flowchart showing a method of determining a feedforward manipulated value. Each step shown in FIG. 4 can be performed by the control device 120. Hereinafter, a feedforward manipulated value may be referred to as an "FF manipulated value" and a feedback manipulated value may be referred to as an "FB manipulated value".

Figure 5A:
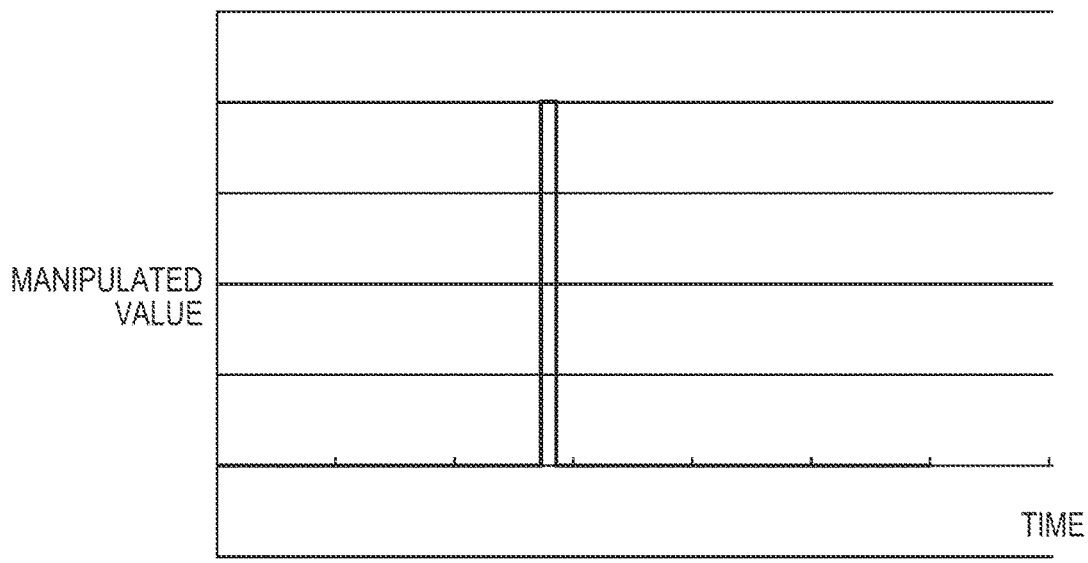
FIG. 5A is a graph showing a first manipulated value.
Figure 5B:
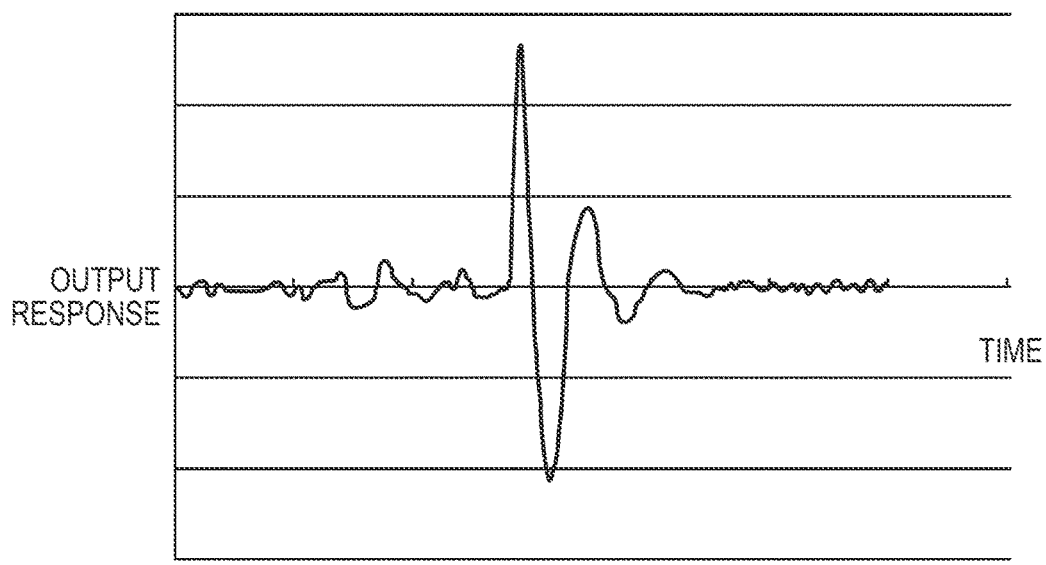
FIG. 5B is a graph showing the output response of the substrate stage.

In step S11, the control device 120 gives a first manipulated value to the substrate stage 114 arranged at a target position, and causes the measurement unit 204 to measure the output response (the first output response) of a position of the substrate stage 114 at that time. In this embodiment, an impulse signal as shown in FIG. 5A is used as the first manipulated value, but another signal such as a step signal or a ramp signal may be used as the first manipulated value. In FIG. 5A, the ordinate represents the manipulated value (amplitude), and the abscissa represents time. FIG. 5B is a graph showing the time-series positions (output responses) of the substrate stage 114 measured by the measurement unit 204 when the impulse signal shown in FIG. 5A is given to the substrate stage 114 as the first manipulated value. In FIG. 5B, the ordinate represents the position of the substrate stage 114, and the abscissa represents time. The output response of the substrate stage 114 as shown in FIG. 5B is also called an "impulse response".

In step S12, the control device 120 determines whether the measurement result of the output response of the substrate stage 114 has been obtained for each of a plurality of target positions. The target position can be set at, for example, the position at which the substrate stage 114 is to be arranged when transferring the pattern of the mask 106 to a shot region on the substrate. In this case, the plurality of target positions may be set so as to include all the positions of the substrate stage 114 for performing pattern formation on a plurality of shot regions on the substrate. Alternatively, the plurality of target positions may be set so as to include only the positions of the substrate stage 114 for performing pattern formation on several shot regions (sample shot regions) out of the plurality of shot regions on the substrate. In step S12, if the measurement result of the output response is obtained for each of the plurality of target positions, the process advances to step S13. On the other hand, if there is any target position for which the measurement result of the output response has not been obtained, the process returns to step S11 and the substrate stage 114 is arranged at the target position to measure the output response.

In step S13, the control device 120 determines a reference value (representative value, specified value) of the output response obtained when the first manipulated value (for example, impulse signal) is given to the substrate stage 114, based on the measurement result of the output response obtained at each of the plurality of target positions. In steps S14 and S15 to be described later, the control device 120 may set an FF manipulated value commonly used at the plurality of target positions, or may set an FF manipulated value individually for each of the plurality of target positions. When setting an FF manipulated value commonly used at the plurality of target positions, the control device 120 can determine, as a reference value, the average value (data indicating the average value for each time) of the measurement results of the output responses obtained at the plurality of target positions. Instead of the average value of the measurement results of the output responses, the control device 120 may determine the maximum value, the minimum value, the median value, or the like of the measurement results as a reference value. When setting an FF manipulated value individually for each target position, the control device 120 may determine, as a reference value, the average value or the like of the measurement results of the output responses obtained at the plurality of target positions, but it may determine a reference value individually for each target position. For example, the control device 120 may determine (select), as a reference value, the measurement result of the output response obtained at the target position for which an FF manipulated value is to be determined, out of the measurement results of the output responses obtained at the plurality of target positions.

In step S14, the control device 120 determines a second manipulated value based on the relationship between the first manipulated value (impulse signal) and the reference value of the output response determined in step S13. The second manipulated value is a manipulated value obtained by combining (coupling) the first manipulated value and a coefficient (gain) that can differ at each of a plurality of times by multiplying the first manipulated value by the coefficient. In other words, the second manipulated value is a manipulated value determined by arraying the plurality of first manipulated values in time-series and multiplying each of the plurality of first manipulated values by a coefficient. Based on an assumption that the first manipulated value and the reference value change in a linear relationship, the control device 120 predicts the output response (the second output response) of the substrate stage 114 that can be obtained when the second manipulated value is given to the substrate stage 114. Then, an approximate calculation for adjusting the coefficient at each time is performed such that the difference between the predicted output response of the substrate stage 114 and a target response falls within an allowable range (preferably, the difference becomes zero), thereby determining the second manipulated value.

The target response is, for example, the control deviation of the substrate stage 114 with respect to each time obtained when only feedback control is performed (the graph as shown in FIG. 2B). The target response can include the output response (control deviation) of the substrate stage 114 in a period from the arrival time of the substrate stage 114 to the target position (time 300 in FIG. 2B) to the settling time of the substrate stage 114 (time 450 in FIG. 2B). However, the target response is not limited to the period from the arrival time to the settling time, and may include the output response of the substrate stage 114 in other periods.

There is a case in which, due to the high-frequency component included in the output response (for example, impulse response) of the substrate stage 114 obtained when the first manipulated value is given thereto, the error does not converge in the approximate calculation for determining the second manipulated value so the second manipulated value cannot be correctly obtained. In this case, the control device 120 may apply a filtering process such as a low-pass filter or a window function to the output response of the substrate stage 114.

In step S15, the control device 120 sets an FF manipulated value based on the second manipulated value determined in step S14. For example, the control device 120 sets, as the FF manipulated value, the manipulated value for reducing the second manipulated value determined in step S14. More specifically, the manipulated value obtained by reversing (inverting) the manipulation direction (that is, the direction in which the substrate stage 114 is to be driven) of the second manipulated value determined in step S14 is set as the FF manipulated value. By giving the FF manipulated value thus set to the substrate stage 114 together with the feedback manipulated value, it is possible to reduce (cancel) the control deviation of the substrate stage 114 that can remain in the feedback control. That is, the settling time of the substrate stage 114 can be shortened. Note that a specific method for determining the second manipulated value in step S14 and setting the FF manipulated value in step S15 is described in Japanese Patent No. 5968017.

As described above, the control device 120 of this embodiment obtains, for each of the plurality of target positions, the measurement result of the output response of the substrate stage 114 obtained when the first manipulated value is given to the substrate stage 114 arranged at the target position. Then, a reference value of the output response of the substrate stage 114 is determined based on the measurement result obtained for each of the plurality of target positions and, based on the determined reference value, an FF manipulated value for reducing the control deviation of the substrate stage 114 is set. By performing position control of the substrate stage 114 by giving the FF manipulated value thus set to the substrate stage 114 together with the FB manipulated value, the control device 120 can shorten the settling time of the substrate stage 114.

In this embodiment, an example in which position control of the substrate stage 114 is performed using both feedback control and feedforward control has been described, but it is possible to perform only feedforward control without using feedback control. For example, without performing feedback control on the control deviation obtained when the substrate stage 114 is moved to a target position, the control device 120 sets the FF manipulated value through the above-described method so as to reduce the control deviation. Then, the control device 120 can perform position control of the substrate stage 114 by giving the set FF manipulated value to the substrate stage 114 (that is, without giving the FB manipulated value).

Second Embodiment

An exposure apparatus of the second embodiment according to the present invention will be described. Since the exposure apparatus of this embodiment has the same arrangement as the exposure apparatus 1 of the first embodiment, a description of the arrangement of the apparatus will be omitted.

In an exposure apparatus (lithography apparatus), it is desired to accurately and quickly move a control target such as a stage holding an original or a substrate to a target position. By performing position control of the stage (substrate stage 114) using the FF manipulated value set as described in the first embodiment, it is possible to accurately and quickly reduce the control deviation of the substrate stage 114 over a wide band. However, in the exposure apparatus 1, when parts in the apparatus (for example, electric cables and piping mounted on the substrate stage 114) deteriorate over time, the output response (that is, impulse response) of the substrate stage 114 obtained when the first manipulated value is given thereto may change. In this case, if the FF manipulated value is used without being updated, it can become difficult to accurately and quickly reduce the control deviation of the substrate stage 114. Therefore, an exposure apparatus 1 of this embodiment obtains an evaluation value concerning the control deviation obtained when position control of a substrate stage 114 is performed by giving the FF manipulated value, and updates the FF manipulated value when the evaluation value is equal to or larger than a threshold.

FIG. 6 is a flowchart showing a process (exposure process) of transferring the pattern of a mask 106 onto each of a plurality of shot regions on a substrate 112 and an update process of an FF manipulated value. Here, as in the first embodiment, each of a plurality of target positions in this embodiment can be a position at which the substrate stage 114 is to be arranged when pattern formation is performed on each of the plurality of shot regions on the substrate 112. In this embodiment, an example of determining whether to update the FF manipulated value for each substrate will be described. However, the present invention is not limited thereto, and the determination may be made for, for example, each lot.

Steps S21 to S24 are for performing an exposure process on each shot region on the substrate 112. In steps S21 to S24, a control device 120 performs position control of the substrate stage 114 by giving a preset FF manipulated value together with an FB manipulated value to the substrate stage 114, and stores the control deviation measured by a measurement unit 204 during this period in a memory 126.

In step S21, so as to arrange a shot region, out of the plurality of shot regions, to be subjected to the exposure process (to be referred to as a target shot region, hereinafter) below a projection optical system 110, the control device 120 moves the substrate stage 114 to the target position for the target shot region. In step S22, the control device 120 determines whether the control deviation of the substrate stage 114 has settled (that is, whether the control deviation is within an allowable range). If it is determined that the control deviation has settled, the process advances to step S23. If it is determined that the control deviation has not settled, step S22 is repeated. In step S23, the control device 120 exposes the target shot region and transfers the pattern of the mask 106 onto the target shot region (exposure process). In step S24, the control device 120 determines whether any shot region (unprocessed shot region) which has not undergone the exposure process is on the substrate 112. If there is any unprocessed shot region, the process returns to step S21 and steps S21 to S24 are performed while setting one of the unprocessed shot regions as the target shot region. On the other hand, if there is no unprocessed shot region, the process advances to step S25.

Steps S25 to S30 are for performing an update process of the FF manipulated value.

In step S25, the control device 120 obtains an evaluation value concerning the control deviation based on the control deviation measured by the measurement unit 204 in step S21 to S24 and stored in the memory 126. For example, the control device 120 can use, as the evaluation values, the values obtained by averaging the time average values and standard deviations of the control deviations in an evaluation period for the plurality of shot regions. More specifically, the control device 120 obtains a time average value M(i) and a standard deviation S(i) of the control deviations in the evaluation period for each shot region by using following equations (1) and (2). In equations (1) and (2), "i" indicates the shot region number, "err (t)" indicates the control deviation (time-series data) in the evaluation period, and "T" indicates the evaluation period (time).

$$M(i) = \frac{1}{T}\sum_{t=0}^{T} err(t) \qquad (1)$$

$$S(i) = \sqrt{\frac{1}{T}\sum_{t=0}^{T}(err(t) - M(i))^2} \qquad (2)$$

Then, by using equations (3) and (4), the control device 120 averages the time average values M(i) and the standard deviations S(i), which are obtained for the respective shot regions, for the plurality of shot regions, and uses the obtained values Mmean and Smean as evaluation values. In equations (3) and (4), "N" indicates the number of shot regions on the substrate. Note that the evaluation values are not limited to the value Mmean and the value Smean obtained by averaging the time average values M(i) and the standard deviations (i), respectively, and other statistical values such as the maximum value and the variance value for the plurality of shot regions may be used as the evaluation values.

$$M_{mean} = \frac{1}{N}\sum_{i=1}^{N} M(i) \qquad (3)$$

$$S_{mean} = \frac{1}{N}\sum_{i=1}^{N} S(i) \qquad (4)$$

Here, although the evaluation period can be arbitrarily set, it can be set to, for example, a period (a period A in FIG. 2B) from the arrival time of the substrate stage 114 to the target position to the end time of the exposure process, or a period (a period B in FIG. 2B) from the settling time of the substrate stage 114 to the end time of the exposure process. In addition, the evaluation period can be set to a period (a period C in FIG. 2B) from the arrival time of the substrate stage 114 to the target position to the settling time of the substrate stage 114, a period (a period D in FIG. 2B) from the movement start time of the substrate stage 114 to the end time of the exposure process, or the like.

When the exposure apparatus 1 is a scanning exposure apparatus, the control device 120 may obtain evaluation values from a synchronous movement average MA and a synchronous movement standard deviation MSD, which are indices of the synchronization error between a mask stage 108 and the substrate stage 114. In this case, the control device 120 obtains the synchronous movement average MA and the synchronous movement standard deviation MSD for each shot region by using following equations (5) and (6), respectively. The statistical value such as the average value, the maximum value, or the variance value of each of the synchronous movement averages MA and the synchronous movement standard deviations MSD for the plurality of shot regions can also be used as the evaluation value. In equations (5) and (6), "y" indicates the position of the substrate stage 114 in the scanning direction (Y-axis direction), "S" indicates the size of the exposure slit, and "sync(y)" indicates the synchronization error at the position y of the substrate stage 114. "N" indicates the number of sample points in the exposure slit. Since the synchronization accuracy between the mask stage 108 and the substrate stage 114 is influenced by the unevenness of the underlying pattern already formed on the substrate, the evaluation value may be obtained while excluding a portion in which the unevenness difference measured by a focus sensor is equal to or larger than a predetermined value.

$$MA(y) = \frac{1}{N}\sum_{p=-S/2}^{S/2} sync(y+p) \qquad (5)$$

$$MSD(y) = \sqrt{\frac{1}{N}\sum_{p=-S/2}^{S/2}(sync(y+p) - MA(y))^2} \qquad (6)$$

Returning to FIG. 6, in step S26, the control device 120 determines whether the evaluation value obtained in step S25 is equal to or larger than a threshold (equal to or larger than a first threshold). The threshold can be set in advance based on the pattern transfer accuracy on the substrate (for example, the positioning accuracy of the substrate stage 114) or the like. If the evaluation value is equal to or larger than the threshold, the process advances to step S27, and the control device 120 outputs information indicating that the evaluation value is equal to or larger than the threshold, that is, information indicating that the FF manipulated value is to be updated (outputs a warning). For example, when a display unit such as an LCD display is provided in the exposure apparatus 1, the control device 120 may output the information to the display unit, or may output the information to a computer, a mobile terminal, or the like used by the operator. On the other hand, if the evaluation value is smaller than the threshold, the process advances to step S30.

In step S28, the control device 120 determines a first manipulated value to be used in the update process of the FF manipulated value in accordance with the evaluation value obtained in step S25.

Figure 7A:
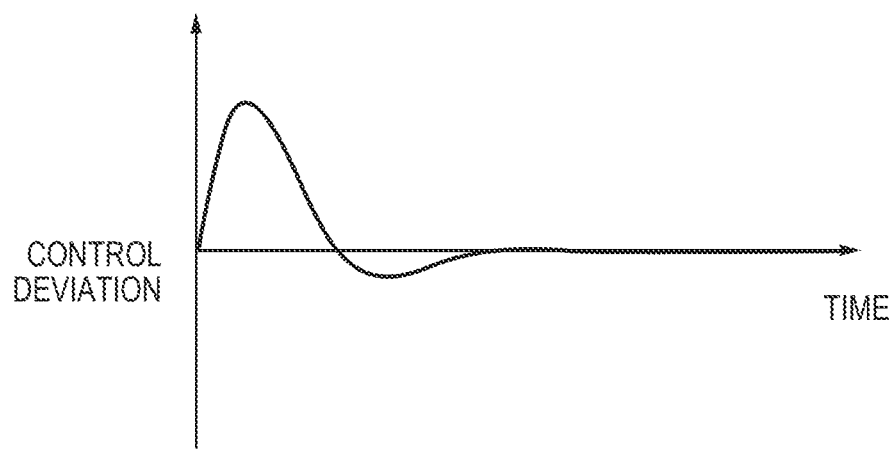
FIG. 7A is a graph showing the control deviation of a substrate stage.

For example, as shown in FIG. 7A, when the control deviation of the substrate stage 114 obtained in steps S21 to S24 contains a lot of low-frequency components of several tens of Hz or less, the value Mmean obtained by using equation (3) as the evaluation value becomes large so that the overlay accuracy can decrease. In this case, it is preferable to increase the application time of the first manipulated value (for example, the time width of the impulse signal) such that the sampling period for obtaining the FF manipulated value becomes longer. Therefore, when the value Mmean is larger than a predetermined value, the control device 120 may determine the first manipulated value such that its application time becomes longer than that of the first manipulated value used when determining the FF manipulated value before the update (for example, such that the larger the value Mmean is, the longer the application time is).

Figure 7B:
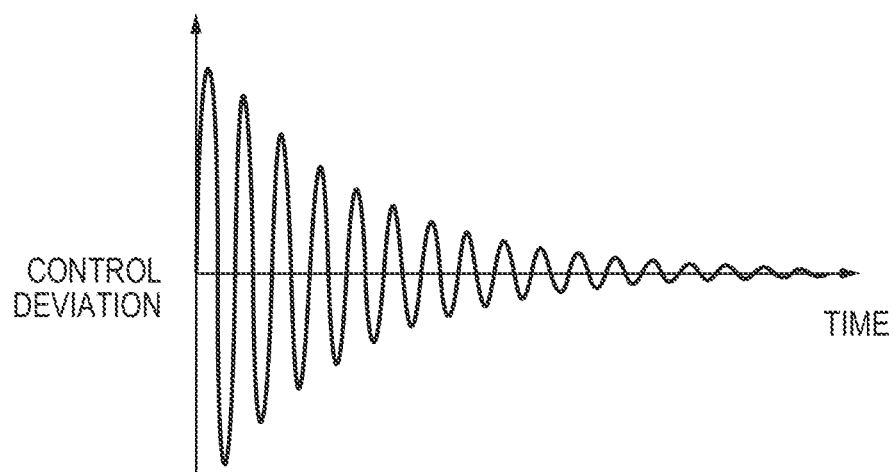
FIG. 7B is a graph showing the control deviation of the substrate stage.

On the other hand, as shown in FIG. 7B, when the control deviation of the substrate stage 114 obtained in steps S21 to S24 contains a lot of high-frequency components of several tens of Hz or more, the value Smean obtained by using equation (4) as the evaluation value becomes large so that the exposure line width can deviate from an allowable range. In this case, it is preferable to decrease the application time of the first manipulated value (for example, the time width of the impulse signal). Therefore, when the value Smean is larger than a predetermined value, the control device 120 may determine the first manipulated value such that its application time becomes shorter than that of the first manipulated value used when determining the FF manipulated value before the update (for example, such that the larger the value Smean is, the shorter the application time is).

The amplitude of the first manipulated value (for example, the amplitude of the impulse signal) is preferably equal to the amplitude of the manipulated value given to the substrate stage 114 in the period during which feedforward control is performed. The feedforward control of this embodiment is based on an assumption that the output response of the substrate stage 114 obtained when the first manipulated value (impulse signal) is given thereto is linearly related to the amplitude of the first manipulated value. To the contrary, the driving mechanism (drive circuit) for driving the substrate stage 114 may have different dynamic characteristics between high output and low output. Accordingly, the control device 120 may determine the first manipulated value by increasing or decreasing the amplitude of the first manipulated value used when determining the FF manipulated value before the update (used previously) by an amount corresponding to a change in manipulated value given to the substrate stage 114 in steps S21 to S24.

In step S29, the control device 120 updates the FF manipulated value by newly determining the FF manipulated value in accordance with the flowchart shown in FIG. 4 while using the first manipulated value determined in step S28. Here, when updating the FF manipulated value for the entire period from the movement start time of the substrate stage 114 to the end time of the exposure process, a long time is spent on the update process and the number of data to be obtained can become very large. Therefore, the control device 120 may update the FF manipulated value for only the period (the period A in FIG. 2B) from the arrival time of the substrate stage 114 to the target position to the end time of the exposure process. Alternatively, the control device 120 may update the FF manipulated value for the period (the period C in FIG. 2B) from the arrival time to the settling time of the substrate stage 114, or the period (the period B in FIG. 2B) from the settling time to the end time of the exposure process.

In step S30, the control device 120 determines whether there is any substrate (unprocessed substrate) that has not undergone the exposure process. If there is any unprocessed substrate, the process returns to step S21. If there is no unprocessed substrate, the process ends.

As described above, the control device 120 of this embodiment obtains an evaluation value concerning the control deviation obtained when position control of the substrate stage 114 is performed by giving the FF manipulated value thereto, and updates the FF manipulated value when the evaluation value is equal to or larger than the threshold. When updating the FF manipulated value, the first manipulated value newly set in accordance with the evaluation value is used. With this arrangement, even when the control deviation changes due to age deterioration or the like of parts in the apparatus, it is possible to update the FF manipulated value at an appropriate timing such that the substrate stage 114 is accurately and quickly moved to the target position.

Third Embodiment

An exposure apparatus of the third embodiment according to the present invention will be described. Basically, the exposure apparatus of this embodiment takes over the exposure apparatus of the second embodiment, and a part different from the second embodiment will be described herein. FIG. 8 is a flowchart showing an exposure process and an update process of an FF manipulated value according to this embodiment. In the flowchart shown in FIG. 8, steps S31 and S32 are added to the flowchart shown in FIG. 6, and the remaining steps are the same as those described in the second embodiment.

In step S31, for each of a plurality of target positions, a control device 120 causes a measurement unit 204 to newly measure the output response of a substrate stage 114 obtained when a first manipulated value determined in step S28 is given. In step S32, for each of the plurality of target positions, the control device 120 obtains the difference (that is, the variation in the output response) between the measurement result of the output response newly obtained in step S31 and the measurement result of the output response previously obtained, and determines whether the obtained difference is equal to or larger than a threshold (equal to or larger than a second threshold). If the difference is equal to or larger than the threshold, the process advances to step S29. If the difference is smaller than the threshold, the process advances to step S30.

Here, in step S32, the control device 120 may determine to update the FF manipulated value when there are a predetermined number of target positions in which the obtained difference is equal to or larger than the threshold. Further, in step S29, the control device 120 may obtain the FF manipulated value only for the target position in which the difference obtained in step S32 is equal to or larger than the threshold. Furthermore, in step S29, the control device 120 may use the measurement result of the output response of the substrate stage 114 obtained in step S31.

The control device 120 of this embodiment determines whether to update the FF manipulated value based on the difference between the measurement result of the output response of the substrate stage 114 obtained when giving the newly determined first manipulated value and the measurement result of the output response of the substrate stage 114 obtained when giving the previously determined first manipulated value. With this arrangement, it is possible to update the FF manipulated value at an appropriate timing such that the substrate stage 114 is accurately and quickly moved to the target position.

Fourth Embodiment

Figure 9:
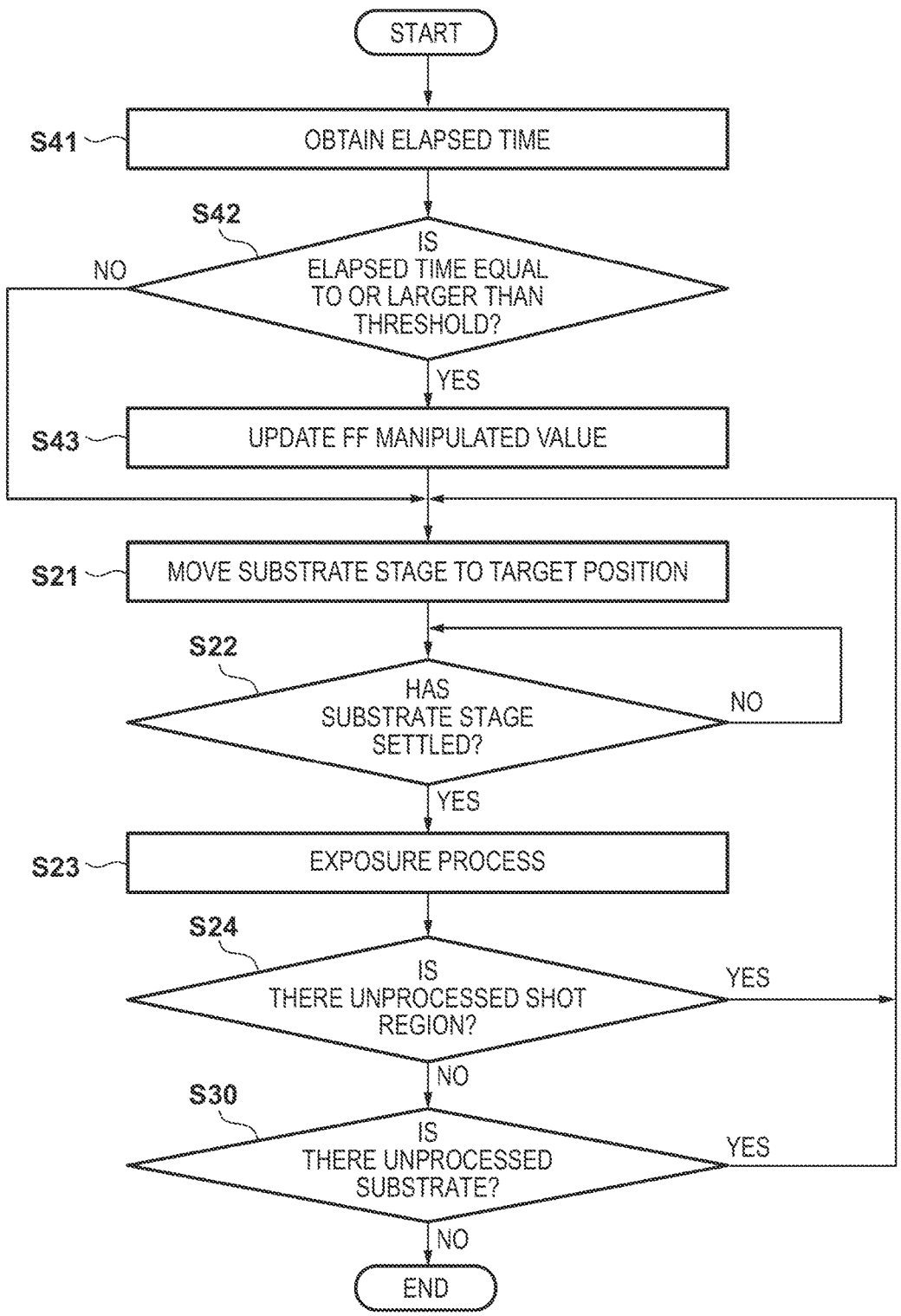
FIG. 9 is a flowchart showing an exposure process and an update process of an FF manipulated value according to the fourth embodiment.

An exposure apparatus of the fourth embodiment according to the present invention will be described. FIG. 9 is a flowchart showing an exposure process and an update process of an FF manipulated value according to this embodiment. Steps S21 to S24 and S30 in the flowchart shown in FIG. 9 are the same as steps S21 to S24 and S30 in the flowchart shown in FIG. 6.

In step S41, a control device 120 obtains the elapsed time since the measurement result of the output response of a substrate stage 114 obtained by giving a first manipulated value was obtained previously (last time). Here, in step S41, instead of the elapsed time since the measurement result of the output response was obtained previously, the elapsed time since the FF manipulated value was set previously (last time) may be obtained. In step S42, the control device 120 determines whether the elapsed time obtained in step S41 is equal to or larger than a threshold (equal to or larger than a third threshold). If the elapsed time is equal to or larger than the threshold, the process advances to step S43. If the elapsed time is smaller than the threshold, the process advances to step S21. In step S43, the control device 120 updates the FF manipulated value by newly determining the FF manipulated value in accordance with the flowchart shown in FIG. 4.

As described above, the control device 120 of this embodiment updates the FF manipulated value in accordance with the elapsed time since the measurement result of the output response of the substrate stage 114 was obtained previously. With this arrangement, it is possible to periodically update the FF manipulated value before the control deviation falls outside an allowable range. Here, steps S41 to S43 of this embodiment can be added to the flowchart shown in FIG. 6 described in the second embodiment or the flowchart shown in FIG. 8 described in the third embodiment.

Embodiment of Method of Manufacturing Article

A method of manufacturing an article according to an embodiment of the present invention suitably manufactures an article, for example, a microdevice such as a semiconductor device or an element having a microstructure. The method of manufacturing an article according to this embodiment includes a step of forming a pattern on a substrate by using the above-described lithography apparatus (exposure apparatus), and a step of processing the substrate on which the pattern has been formed in the above step. In addition, the manufacturing method includes other well-known steps (for example, oxidation, film formation, deposition, doping, planarization, etching, resist removal, dicing, bonding, and packaging). The method of manufacturing an article according to this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-088405 filed on May 1, 2018, which is hereby incorporated by reference herein in its entirety.

What is claimed is:

1. A control device that performs position control of a control target by giving a feedforward manipulated value to the control target, wherein the control device is configured to:
   obtain, for each of a plurality of positions at which the control target is to be arranged, a measurement result of a first output response of the control target obtained when giving a first manipulated value to the control target;
   determine a reference value of the first output response, based on the measurement results respectively obtained at the plurality of positions;
   determine a second manipulated value by arraying a plurality of first manipulated values in time-series and multiplying each of the plurality of first manipulated values by a coefficient, wherein the coefficient is adjusted such that a difference between a second output response of the control target predicted when giving the second manipulated value to the control target and a target response falls within an allowable range, and the second output response is predicted based on a relationship between the first manipulated value and the reference value; and
   set the feedforward manipulated value based on the second manipulated value.

2. The control device according to claim 1, wherein the control device is configured to set the feedforward manipulated value commonly used at the plurality of positions.

3. The control device according to claim 1, wherein the control device is configured to set the feedforward manipulated value individually for each of the plurality of positions.

4. The control device according to claim 3, wherein the control device is configured to determine, as the reference value, the measurement result selected from the measurement results respectively obtained at the plurality of positions in accordance with a position for which the feedforward manipulated value should be set.

5. The control device according to claim 1, wherein the control device is configured to determine, as the reference value, an average value of the measurement results respectively obtained at the plurality of positions.

6. The control device according to claim 1, wherein the control device is configured to determine an evaluation value based on a control deviation obtained when performing position control of the control target by giving the feedforward manipulated value, and update the feedforward manipulated value when the determined evaluation value is not less than a threshold.

7. The control device according to claim 6, wherein
   the control target is a stage configured to hold a substrate, and
   the control device is configured to obtain the evaluation value based on the control deviation in a period from an arrival time of the stage to a target position until an end time of pattern formation to the substrate at the target position.

8. The control device according to claim 7, wherein
the plurality of positions include target positions at which the stage is to be arranged for performing pattern formation on a plurality of regions in a substrate held by the stage, and
the control device is configured to determine, as the evaluation value, at least one of an average value and a standard deviation of the control deviations obtained when the stage is arranged at the target positions.

9. The control device according to claim 6, wherein
the control target is a stage configured to hold a substrate, and
the control device is configured to obtain the evaluation value based on the control deviation in a period from a time at which the stage has arrived and settled at a target position until an end time of pattern formation to the substrate at the target position.

10. The control device according to claim 9, wherein
the plurality of positions include target positions at which the stage is to be arranged for performing pattern formation on a plurality of regions in a substrate held by the stage, and
the control device is configured to determine, as the evaluation value, at least one of an average value and a standard deviation of the control deviations obtained when the stage is arranged at the target positions.

11. The control device according to claim 6, wherein the control device is configured to update the feedforward manipulated value by using the first manipulated value while changing an application time thereof in accordance with the evaluation value.

12. The control device according to claim 6, wherein the control device is configured to update the feedforward manipulated value by using the first manipulated value while changing an amplitude thereof in accordance with a change in manipulated value given to the control target.

13. The control device according to claim 6, wherein the control device is configured to, if the evaluation value is not less than the threshold, output information indicating that the feedforward manipulated value is to be updated.

14. The control device according to claim 6, wherein the control device is configured to, if the evaluation value is not less than the threshold, obtain a measurement result of the first output response, and if a difference between the newly obtained measurement result and a previously obtained measurement result is not less than a second threshold, update the feedforward manipulated value.

15. The control device according to claim 1, wherein the control device is configured to, if an elapsed time since the first output response is measured is not less than a third threshold, update the feedforward manipulated value.

16. The control device according to claim 1, wherein the first manipulated value is one of an impulse signal, a step signal, and a ramp signal.

17. A lithography apparatus that forms a pattern on a substrate, comprising
a stage configured to be movable while holding the substrate; and
a control device configured to perform position control of the stage as a control target, by giving a feedforward manipulated value to the control target,
wherein the control device is configured to:
obtain, for each of a plurality of positions at which the control target is to be arranged, a measurement result of a first output response of the control target obtained when giving a first manipulated value to the control target;
determine a reference value of the first output response, based on the measurement results respectively obtained at the plurality of positions;
determine a second manipulated value by arraying a plurality of first manipulated values in time-series and multiplying each of the plurality of first manipulated values by a coefficient, wherein the coefficient is adjusted such that a difference between a second output response of the control target predicted when giving the second manipulated value to the control target and a target response falls within an allowable range, and the second output response is predicted based on a relationship between the first manipulated value and the reference value; and
set the feedforward manipulated value based on the second manipulated value.

18. A method of manufacturing an article, the method comprising:
forming a pattern on a substrate using a lithography apparatus;
processing the substrate, on which the pattern has been formed, to manufacture the article,
wherein the lithography apparatus includes:
a stage configured to be movable while holding the substrate; and
a control device configured to perform position control of the stage as a control target, by giving a feedforward manipulated value to the control target,
wherein the control device is configured to:
obtain, for each of a plurality of positions at which the control target is to be arranged, a measurement result of a first output response of the control target obtained when giving a first manipulated value to the control target;
determine a reference value of the first output response, based on the measurement results respectively obtained at the plurality of positions;
determine a second manipulated value by arraying a plurality of first manipulated values in time-series and multiplying each of the plurality of first manipulated values by a coefficient, wherein the coefficient is adjusted such that a difference between a second output response of the control target predicted when giving the second manipulated value to the control target and a target response falls within an allowable range, and the second output response is predicted based on a relationship between the first manipulated value and the reference value; and
set the feedforward manipulated value based on the second manipulated value.

19. A control device that performs position control of a control target by giving a feedforward manipulated value to the control target, wherein the control device is configured to:
respectively obtain, for a plurality of positions at which the control target is to be arranged, first output responses of the control target measured when giving a first manipulated value to the control target;
determine a second manipulated value based on the first manipulated value, the first output responses respectively obtained for the plurality of positions, and coefficients different from each other at a plurality of times; and
set the feedforward manipulated value based on the second manipulated value.

20. The control device according to claim 19, wherein the control device is configured to determine the second manipulated value by adjusting the coefficients such that a difference between a second output response of the control target when giving the second manipulated value to the control target and a target response falls within an allowable range.

21. The control device according to claim 19, wherein the control device is configured to obtain a reference value of the first output responses respectively obtained for the plurality of positions, and determine the second manipulated value based on the first manipulated value and the reference value.

22. The control device according to claim 19, wherein the control device is configured to determine the second manipulated value by coupling values obtained by respectively multiplying the first manipulated value by the coefficients.

23. The control device according to claim 19, wherein the control device is configured to set the feedforward manipulated value commonly used at the plurality of positions.

24. The control device according to claim 19, wherein the control device is configured to set feedforward manipulated value individually for each of the plurality of positions.

25. The control device according to claim 21, wherein the control device is configured to determine, as the reference value, an average value of the first output responses respectively obtained for the plurality of positions.

26. The control device according to claim 19, wherein the control device is configured to determine an evaluation value based on a control deviation obtained when performing position control of the control target by giving the feedforward manipulated value, and update the feedforward manipulated value in a case where the determined evaluation value is not less than a threshold.

27. The control device according to claim 19, wherein the first manipulated value is one of an impulse signal, a step signal, and a ramp signal.

28. A lithography apparatus that forms a pattern on a substrate, comprising:
 a stage configured to be movable while holding the substrate; and
 a control device configured to perform position control of the stage by giving a feedforward manipulated value to the stage,
 wherein the control device is configured to:
  respectively obtain, for a plurality of positions at which the stage is to be arranged, first output responses of the stage measured when giving a first manipulated value to the stage;
  determine a second manipulated value based on the first manipulated value, the first output responses respectively obtained for the plurality of positions, and coefficients different from each other at a plurality of times; and
  set the feedforward manipulated value based on the second manipulated value.

29. A method of manufacturing an article, the method comprising:
 forming a pattern on a substrate using a lithography apparatus;
 processing the substrate, on which the pattern has been formed, to manufacture the article,
 wherein the lithography apparatus includes:
  a stage configured to be movable while holding the substrate; and
  a control device configured to perform position control of the stage by giving a feedforward manipulated value to the stage,
 wherein the control device is configured to:
  respectively obtain, for a plurality of positions at which the stage is to be arranged, first output responses of the stage measured when giving a first manipulated value to the stage;
  determine a second manipulated value based on the first manipulated value, the first output responses respectively obtained for the plurality of positions, and coefficients different from each other at a plurality of times; and
  set the feedforward manipulated value based on the second manipulated value.

* * * * *